United States Patent [19]
Morelos-Zaragoza

[11] Patent Number: 6,081,920
[45] Date of Patent: Jun. 27, 2000

[54] METHOD AND APPARATUS FOR FAST DECODING OF A REED-SOLOMON CODE

[75] Inventor: Robert Morelos-Zaragoza, San Jose, Calif.

[73] Assignee: LSI Logic Corporation, Milpitas, Calif.

[21] Appl. No.: 09/004,748

[22] Filed: Jan. 8, 1998

[51] Int. Cl.[7] .................................................. H03M 13/00
[52] U.S. Cl. ............................................ 714/785; 714/784
[58] Field of Search .................................... 714/785, 784, 714/781

[56] References Cited

U.S. PATENT DOCUMENTS 5,600,659  2/1997  Chen ........................................ 714/752
5,771,246  6/1998  Weng ........................................ 714/762
5,805,617  10/1998  Im ............................................ 714/785

*Primary Examiner*—Albert De Cady
*Assistant Examiner*—Jason Greene

[57] ABSTRACT

A method and apparatus for fast decoding of a Reed-Solomon codeword which includes storing the codeword in memory, finding syndromes of the codeword, using the syndromes to determine the number of errors in the codeword, which in turn are used to find an error locator polynomial for the codeword, which is a polynomial whose roots can be used to find the locations of the errors. This error locator polynomial is then be used to find the positions of the errors in the codeword. The positions of the errors in the codeword can be used along with the syndromes to determine the values of the errors in the codeword.

4 Claims, 2 Drawing Sheets

METHOD AND APPARATUS FOR FAST DECODING OF A REED-SOLOMON CODE

BACKGROUND OF THE INVENTION

1. Field of the Invention

The present invention relates to the decoding of Reed-Solomon codes. More particularly, the present invention relates to a method and an apparatus for fast decoding of Reed-Solomon codes.

2. The Prior Art

Reed-Solomon (RS) codes are used in many different applications, but one of their most popular uses is in data transmission. Through the use of an RS encoder, data can be converted to an RS code, transmitted over a data communications medium, and then decoded on the receive side by an RS decoder, which can then correct errors encountered during transit. This technique has a wide variety of uses, including cable modems and satellite transmissions.

Cable modems are devices that work in a similar manner to the typical computer modems (which transmit data over telephone lines), except that they use cable television lines for the transmission. Due to the higher bandwidth capability of cable lines, cable modems are capable of much higher data transfer speeds than phone lines. With the increased popularity of the Internet, high speed data transmission lines are becoming more and more important in the marketplace. Cable modems have emerged as one of the leading forms of Internet communication.

Most cable modems contain two pieces of equipment for dealing with RS codes: an RS encoder and an RS decoder. Data to be sent is first separated into sequences of bytes with equal lengths. Most cable modems in use today split the data into sequences 122 bytes in length. Each of these sequences is known as a word. Each word is then passed through the RS encoder, which translates it into a Reed-Solomon codeword with a length of 128 bytes. Typical Reed-Solomon codewords have a length of 127 bytes. However, cable modem systems generally add an extra redundant bit (called an extended bit) to increase the error-correcting capability. This codeword can then be transmitted through the cable to the recipient. During this transmission, however, interference can sometimes change the encoded data so that it arrives at its destination in a distorted form. These changes in the data are known as errors. When the codeword reaches the RS decoder, it oftentimes will have to not only be decoded, but error-corrected as well.

In order to correct errors that occurred during transmission, the error positions (which bytes were affected) as well as the error values (how each byte was affected) must be determined. The prior art techniques for decoding and error-detection are based on either a Berlekamp-Massey algorithm or a Euclidean algorithm. These algorithms generally represent the RS codeword as a polynomial. Syndromes of this polynomial can then be found. Syndromes are parity check equations that will eventually be used to find the error locations and values. The drawback of these techniques is that they attempt to find the number of errors and their positions without knowledge of the specific error correcting capability of the code.

Reed-Solomon codes have a specific error correcting capability based on the length of the code. The number of bytes in a codeword can be represented by the formula:

of bytes=$2^d$+n

Where minimum distance d is the largest number that can satisfy this equation when n is zero or a positive integer.

Thus, a code of length 127 bytes, has a minimum distance of 6 (127=$2^6$+63). The error-correcting capability a RS code can then be determined by the formula:

$$t \le \frac{d-1}{2}$$

where t is the largest whole number which satisfies this equation and represents the error-correcting capability of an RS code with minimum distance d.

Therefore, the codeword of length 127 bytes has an error correcting capability of 2, meaning that at most 2 errors can be corrected in a RS codeword of length 127 bytes. Simply by adding one more byte (for a total of 128), the error correcting capability can be increased to 3. This is why cable modem systems use extended Reed-Solomon codes (having the extended bit) rather than normal Reed-Solomon codes.

The main drawback of the prior art decoders is that they use methods that are designed for codes with relatively high error correcting capabilities (t>3). For codes with an error correcting capabilities of 3 or less, the prior art methods are too complex to implement in a truly time effective manner. What is needed is a fast technique to decode and detect errors in codes with error correcting capabilities of 3 or less.

BRIEF DESCRIPTION OF THE INVENTION

A method and apparatus for fast decoding of a Reed-Solomon codeword which includes storing the codeword in memory, finding syndromes of the codeword, using the syndromes to determine the number of errors in the codeword, which in turn are used to find an error locator polynomial for the codeword, which is a polynomial whose roots can be used to find the locations of the errors. This error locator polynomial is then used to find the positions of the errors in the codeword. The positions of the errors in the codeword can be used along with the syndromes to determine the values of the errors in the codeword.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
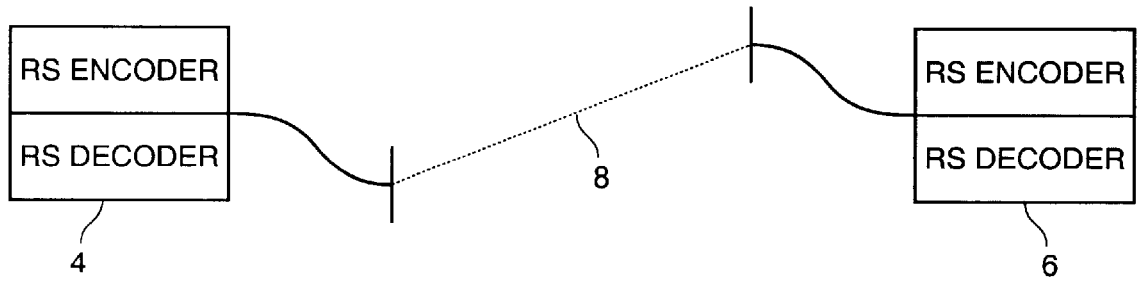
FIG. 1 is an example of a complete cable modem system, including a first end such as a user end and a second end such as a provider end.

The present invention can be used in any type of RS decoder, no matter what type of data is being encoded and decoded. This means that just about any communications medium (digital satellite systems, telephones, etc.) can use the present invention. However, the preferred embodiment described in the present application is designed for use in a cable modem system. Referring to FIG. 1, an example of the decoder-encoder system is shown. Each side of the cable modem connection contains both an RS encoder and an RS decoder. Provider 4 generates data that it wishes to transmit to user 6. Provider 4 then passes the data through its RS encoder, which translates it into an RS codeword. The RS codeword is then transmitted through the cable system 8 and eventually to user 6. User 6 receives the codeword and passes it through its RS decoder, where it is translated to usable data.

If user 6 wishes to transmit data to provider 4, it does it in a similar way. User 6 passes the data to its RS encoder, where it is translated into an RS codeword. This codeword is then transmitted through the cable system 8 to the provider 4, where it is passed through its RS decoder and translated into usable data.

The present invention relates to the implementation of the RS decoder. Specifically, the present invention relates to the error correcting function of this RS encoder. The rest of the RS encoder, which functions to simply translate of the RS codeword is known in the prior art.

In accordance with a presently preferred embodiment of the present invention, an RS codeword of length 128 bytes is used. This is known as an "extended" RS code because of the extra byte that is added over the prior art 127. This extra byte is known as the extended position and has the effect of raising the length of the code to 128 bytes, which allows an error-correcting capability of 3, rather than 2. This data contained in the extra byte is irrelevant, since it is only used in order to allow for a fast decoding of the prior 127. This is only one embodiment of a codeword, and the present invention will work for codewords of any length.

This codeword is received by the decoder and stored in the receiver 10. The codeword is stored in memory. This memory can be any type of memory (buffer, register, RAM, etc.) The type of memory is irrelevant, as long as there is some mechanism to perform multiple operations on the codeword. It is even possible to perform all of the decoding on a hardwired chip, without a single piece of hardware that can be known as memory. However, in this case there still must be a mechanism for "holding" the codeword so that multiple operations can be performed on it. In addition, since the codeword itself will likely be received as a stream of information, there must be such a holding mechanism in order to store the received bytes while the decoder is in the process of receiving the rest of the bytes. Therefore, the term "memory" in this application means any mechanism that can be used to hold information. Since the invention can be performed by either hardware or software, however, those of ordinary skill in the art will recognize that there are a plurality of different ways to accomplish this.

Once the codeword is received, there must be some system to convert the codeword into usable data. In order to speed the implementation, it is possible to do all of the computations required over a Galois field. A Galois field is commonly known in the art as a specific type of finite field of elements. All of the symbols that can possibly be contained in the word that is transmitted can be represented by a combination of these elements. While working in these fields can be incredibly complex on paper, when implemented using computers or circuits, computations within the field can be accomplished at a much faster rate. This is because they can be implemented using shift registers, and thus all of the computations between the elements of a Galois field can be accomplished simply by shifting the data by a number of positions. Another advantage of using Galois fields is that division does not have any rounding errors. The preferred embodiment of the present invention performs all the computations in a Galois field. However, one of ordinary skill in the art will recognize that the same computations could be performed with a different field, or with no field at all.

The RS decoder is usually implemented in hardware since hardware can generally perform the steps faster than software can. However, the present invention should not be limited to just a hardware implementation. In addition, the preferred embodiment of the invention is designed to decode codewords of length 128 bytes. Those of ordinary skill in the art will recognize that the present invention could also be constructed to decode words of any other length.

Figure 2:
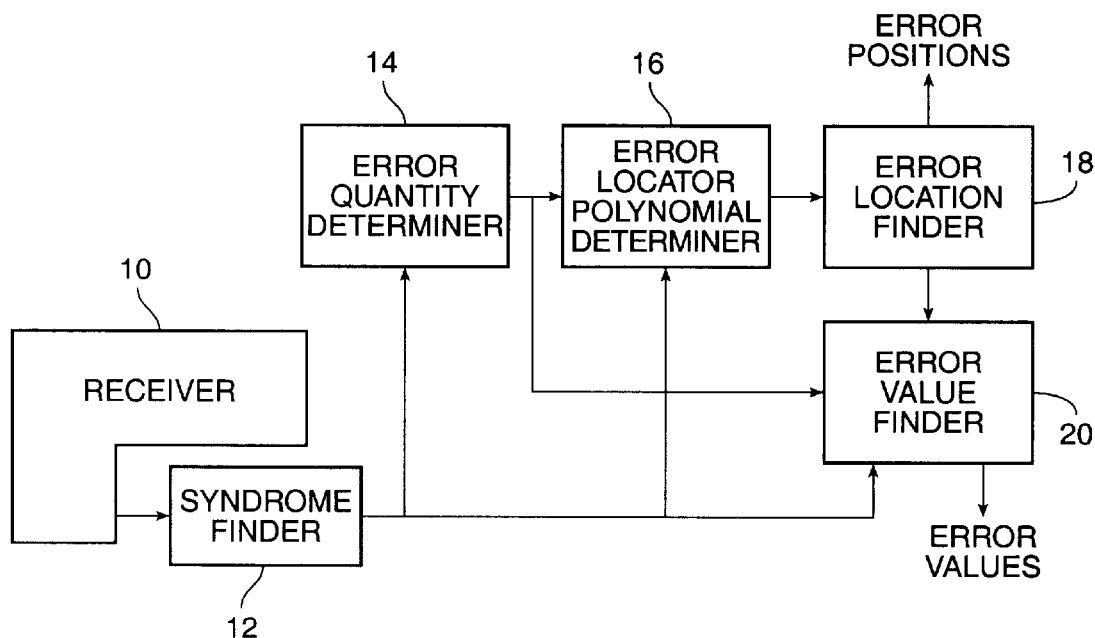
FIG. 2 is a block diagram of the error correcting mechanism of an RS decoder in accordance with a presently preferred embodiment of the present invention.

Referring to FIG. 2, the data, consisting of a codeword of length 128 bytes, is first stored in a receiver 10 (which may include memory). It can then be passed to a syndrome finder 12 which determines the syndromes of the word. The syndromes are parity check equations that will eventually allow the decoder to determine the error positions and their values. The step of determining the syndromes is known in the prior art. Syndromes are determined by using the following formula:

$$S_i = \sum_{j=0}^{n-1} r_j \alpha^{ij}$$

for $i=1, 2, \ldots, 5$ and n is the cyclic length of each word (the length of the word without the extended bit or bits, here 127), $\alpha$ is the primitive element of the Galois field, and $r_j$ is the symbol contained in the byte corresponding to position j (in the preferred embodiment, each word has position 0 through position 126—the extended because it contains no relevant information).

The computed syndromes can then be passed to the other components which may use them in their own calculations. The error quantity determiner 14 receives the computed syndromes ($S_1$ through $S_5$) and determines the number of errors in the code. If all of the syndromes are 0, this signals to the component that there were no errors in the word, and thus computing can stop. Otherwise, the number of errors that occurred must be determined so that the quickest computations of the positions and values of the errors can be performed. First, the error quantity determiner 14 tests to see if there are 3 errors. This is accomplished by placing the syndromes in a 3×3 matrix as follows:

$$\begin{bmatrix} S_1 & S_2 & S_3 \\ S_2 & S_3 & S_4 \\ S_3 & S_4 & S_5 \end{bmatrix}$$

Then the determinant of this matrix can be computed. This determinant is computed in the manner known in the art. However, since the values used in finding the determinant may be re-used later in the computational process, it is helpful to show the process in its entirety. First, $A_1$, $A_2$, and $A_3$ are determined using the following equations:

$$A_1 = S_3 S_5 + S_4^2$$

$$A_2 = S_2 S_5 + S_3 S_4$$

$$A_3 = S_2 S_4 + S_3^2$$

then the determinant $\sigma_0$ can be found using the equation:

$$\sigma_0 = S_1 A_1 + S_2 A_2 + S_3 A_3$$

If this determinant $\sigma_0$ is not equal to 0, then 3 errors exist in the word. If this is the case, then the decoder can move on to the step of detecting error positions and values. The error locator polynomial determiner 16 will compute an error locator polynomial, which can be used to determine the positions of the errors. In order to solve for 3 error positions and 3 error values, however, six syndromes ($S_1$ through $S_6$) and six coefficients ($A_1$ through $A_6$) are needed. For an extended code, the extra syndrome ($S_6$) can be computed using the formula:

$$S_6 = \sum_{j=0}^{n-1} r_j \alpha^{6j} + r_n$$

where n is the cyclic length of the codeword

Then $A_4$ through $A_6$ can be determined by the equations:

$$A_4 = S_1 S_5 + S_3^2$$
$$A_5 = S_1 S_4 + S_2 S_3$$
$$A_6 = S_1 S_3 + S_2^2$$

Finally, error locator polynomial coefficients can be computed by the following equations:

$$\sigma_1 = S_4 A_1 + S_5 A_2 + S_6 A_3$$
$$\sigma_2 = S_4 A_2 + S_5 A_4 + S_6 A_5$$
$$\sigma_3 = S_4 A_3 + S_5 A_5 + S_6 A_6$$

These error locator polynomial coefficients define the error locator polynomial, which can then be passed to the error location finder 18.

If, on the other hand, back in the error quantity determiner 14, $\sigma_0$ had equaled 0, then there would have been less than 3 errors. Then, the error quantity determiner 14 would determine if there were 2 errors. This is accomplished by finding the determinant $\sigma_0$ of the following matrix:

$$\begin{bmatrix} S_1 & S_2 \\ S_2 & S_3 \end{bmatrix}$$

If this $\sigma_0$ does not equal 0, then there are 2 errors in the word. The error locator polynomial can then be determined and passed to the next component by using the following equations:

$$\sigma_1 = S_1 S_4 + S_2 S_3$$
$$\sigma_2 = A_3$$

If this $\sigma_0$ had not equaled 0, then the component finds the determinant $\sigma_0$ of the 1×1 matrix containing only $S_1$. (or $\sigma_0 = S_1$). If this $\sigma_0$ equals 0, then the decoder knows that there were errors detected in the codeword, but it was unable to determine what those errors were. If this $\sigma_0$ does not equal 0, the decoder knows that there is only 1 error in the word (a result of zero errors would have been detected at the beginning of this component). The error locator polynomial could then be determined and passed to the next component by using the equation:

$$\sigma_1 = S_2$$

The error location finder 18 determines the location of the errors. This is accomplished by finding the inverses of the roots of the error locator polynomial, which can be represented by the following equation:

$$\sigma(x) = \sum_{i=0}^{e} \sigma_i x^i$$

where e is the number of errors in the word.

This can be accomplished by substituting the elements 1, $\alpha, \alpha^2, \ldots, \alpha^{126}$ for x. The result will be that e of the elements 1, $\alpha, \alpha^2, \ldots, \alpha^{126}$ will cause the error locator polynomial to be equal to 0. The powers of these three elements will be the position in which the error was found. However, the position will be read from the last byte to the first. Therefore, the inverse of the position must be determined (which, since this is computed in a Galois field, will give the position as it read from first byte to last, i.e. if $\alpha^2$ is a root, then the inverse of the 2nd position is the error location, which gives an error in the 125th byte (out of 127)). Now that the errors have been located, all that is left is to determine what the errors are. This is accomplished using the error value finder 20.

The positions of the errors can be represented by $X_1$ through $X_e$ where e is the number of errors. For a word with 3 errors, we have $X_1$, $X_2$, and $X_3$. We wish to determine the values of the errors, which can be represented by $Y_1$, $Y_2$, and $Y_3$, which can be computed by using the equation:

$$\begin{bmatrix} X_1 & X_2 & X_3 \\ X_1^2 & X_2^2 & X_2^2 \\ X_1^3 & X_2^3 & X_2^3 \end{bmatrix} \begin{bmatrix} Y_1 \\ Y_2 \\ Y_3 \end{bmatrix} = \begin{bmatrix} S_1 \\ S_2 \\ S_3 \end{bmatrix}$$

if e=2, the 2×2 matrix equation can be used as follows:

$$\begin{bmatrix} X_1 & X_2 \\ X_1^2 & X_2^2 \end{bmatrix} \begin{bmatrix} Y_1 \\ Y_2 \end{bmatrix} = \begin{bmatrix} S_1 \\ S_2 \end{bmatrix}$$

if e=1, the $Y_1$ can be represented simply by the equation:

$$Y_1 = X_1^{-1} S_1$$

Whichever of these equations the decoder solves, it can compute the answer using standard techniques for matrix algebra. The decoder then has solved for the error positions and the error values (how much each error distorts the original byte). The decoder can then proceed to correct the errors (possibly by incorporating a corrector which modifies the codeword stored in memory using the error locations and the error values) and finish the decoding process.

Figure 3:
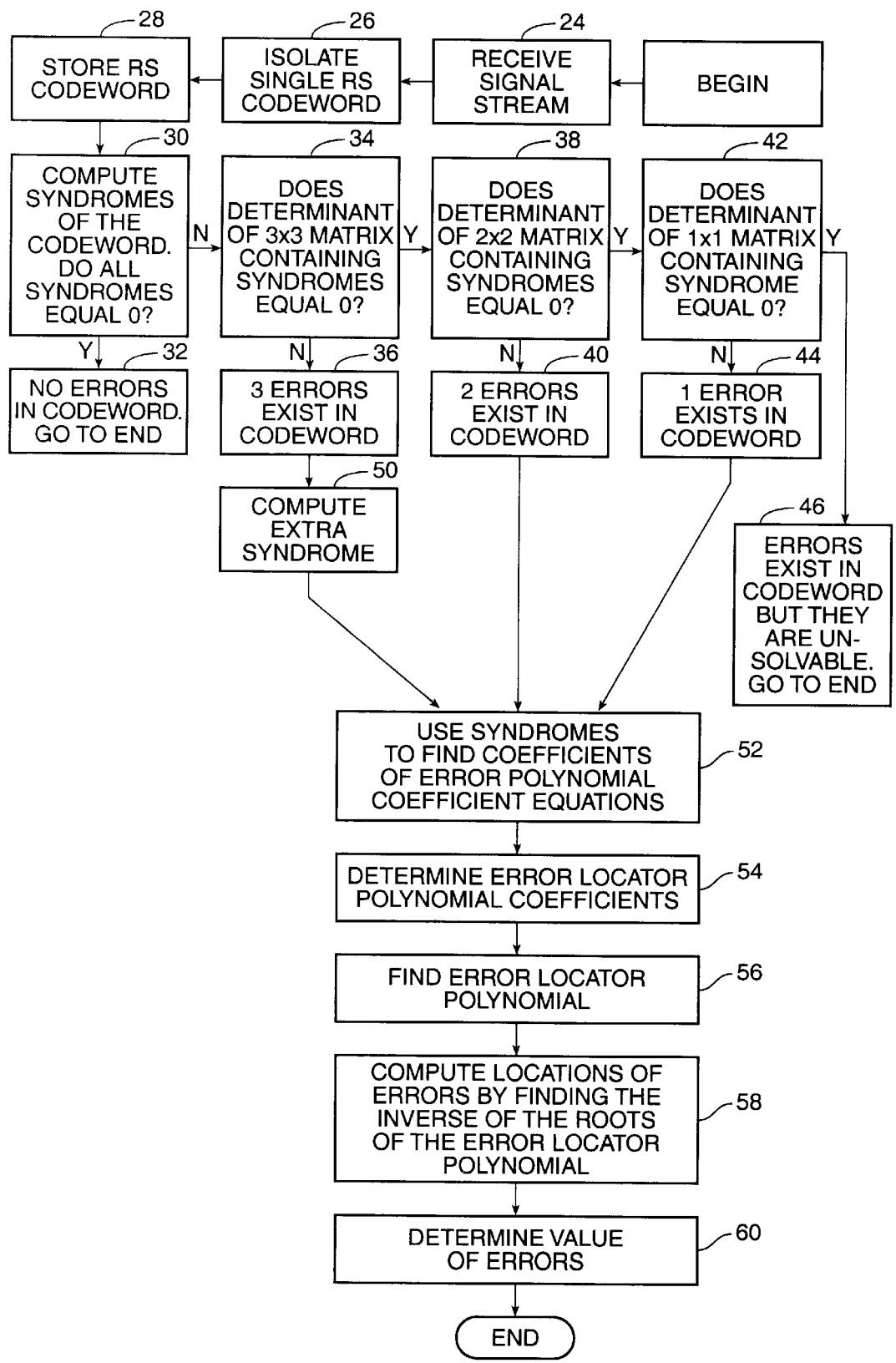
FIG. 3 is a flow diagram of the method used by the RS decoder in the preferred embodiment of the invention.

This invention can also be described as a method for decoding an RS code. Referring to FIG. 3, first the signal stream is received at step 24. This signal stream will likely consist of a plurality of RS codewords. Therefore, the system must then isolate a single RS codeword for decoding at step 26. Depending upon how the data is received, this can be accomplished in a variety of ways. This single RS codeword is then stored 28 so that the various computations can be performed on it.

At this point, the syndromes are computed at step 30. If all of the syndromes are equal to zero, no errors exist in the codeword and the process may end at step 32. If not all of the syndromes equal zero, the decoder checks if the determinant of the 3×3 matrix containing the syndromes equals zero at step 34. If not, 3 errors exist in the code word at step 36. If so, the decoder checks if the determinant of the 2×2 matrix containing the syndromes equals zero at step 38. If no, 2 errors exist in the code word at step 40. If so, the decoder checks if the determinant of the 1×1 matrix containing $S_1$ equals zero. If not, 1 error exists in the codeword at step 44. If so, then errors were detected, but the decoder is unable to solve for them, thus the process must end at step 46.

If 3 errors were detected, an extra syndrome must be computed at step 50. Then, if 1–3 errors were detected, the process can then continue on to find the error locator polynomial. First, the syndromes are used to find the coefficients of the error locator coefficient equations at step 52. Then, the error locator polynomial coefficients can be determined at step 54. Finally, the error locator polynomial can be determined at step 56.

After the error locator polynomial has been determined, the locations of the errors can be found by finding the inverses of the roots of the error locator polynomial at step 58. Then, the values of the errors can be determined by using the syndromes and the error locations at step 60.

While embodiments and applications of this invention have been shown and described, it would be apparent to those skilled in the art that many more modifications than mentioned above are possible without departing from the inventive concepts herein. The same techniques could be implemented to decode RS codes with error-correcting capabilities of more than 3. In addition, similar techniques could be used on RS codes without doing all of the computations in a Galois field, or on codes of a different length, or in communications systems other than cable modems. The invention, therefore, is not to be restricted except in the spirit of the appended claims.

What is claimed is:

1. A method for error correcting an RS codeword in a communications system comprising the steps of:

receiving a signal stream representing a plurality of RS codewords;

isolating a single RS codeword;

storing the codeword in memory;

determining the syndromes of the codeword;

determining the number of errors in the codeword using said syndromes, comprising the steps of:

returning a value of 0 for said number of errors in the codeword and ending all of said steps if all of said syndromes are equal to 0;

determining the determinant for a 3×3 matrix containing said syndromes if not all of said syndromes are equal to 0;

returning a value of 3 for said number of errors in the codeword if said determinant of said 3×3 matrix is not equal to 0;

determining the determinant for a 2×2 matrix containing said syndromes if said determinant of said 3×3 matrix is not equal to 0;

returning a value of 2 for said number of errors in the codeword if said determinant of said 2×2 matrix is not equal to 0;

determining the determinant for a 1×1 matrix containing said syndromes if said determinant of said 2×2 matrix is not equal to 0;

returning a value of 1 for said number of errors in the codeword if said determinant of said 1×1 matrix is not equal to 0;

returning a condition that errors exist in the codeword, but the errors are unsolvable if said determinant of said 1×1 matrix is equal 0;

finding the error locator polynomial of the codeword;

determining the locations of the errors by finding the inverses of the roots of said error locator polynomial; and determining the values of the errors by using the locations of the errors and the syndromes.

2. A method for decoding an RS codeword in a communications system comprising the steps of:

storing the codeword in memory;

determining the syndromes of the codeword;

determining the number of errors in the codeword using said syndromes comprising the steps of:

returning a value of 0 for said number of errors in the codeword and ending all of said steps if all of said syndromes are equal to 0;

determining the determinant for a 3×3 matrix containing said syndromes if not all of said syndromes are equal to 0;

returning a value of 3 for said number of errors in the codeword if said determinant of said 3×3 matrix is not equal to 0;

determining the determinant for a 2×2 matrix containing said syndromes if said determinant of said 3×3 matrix is not equal to 0;

returning a value of 2 for said number of errors in the codeword if said determinant of said 2×2 matrix is not equal to 0;

determining the determinant for a 1×1 matrix containing said syndromes if said determinant of said 2×2 matrix is not equal to 0;

returning a value of 1 for said number of errors in the codeword if said determinant of said 1×1 matrix is not equal to 0;

returning a condition that errors exist in the codeword, but the errors are unsolvable if said determinant of said 1×1 matrix is equal 0;

finding the error locator polynomial of the codeword;

determining the locations of the errors by finding the inverses of the roots of said error locator polynomial; and determining the values of the errors by using the locations of the errors and the syndromes;

correcting the codeword in memory using said locations of the errors and said values of the errors; and decoding the corrected codeword.

3. An apparatus for error correcting an RS codeword in a communications system comprising:

a receiver which receives and stores the codeword in memory;

a syndrome finder which determines the syndromes of the codeword;

an error quantity determiner which determines the number of errors in the codeword using said syndromes, wherein said error quantity determiner comprises:

a first portion which returns a value of 0 for said number of errors in the codeword and ends the decoding process if all the said syndromes are equal to 0;

a second portion which determines the determinant for a 3×3 matrix containing said syndromes;

a third portion which, if said determinant of said 3×3 matrix is not equal to 0, returns a value of 3 for said number of errors in the codeword;

a fourth portion which, if said determinant of said 3×3 matrix is not equal to 0, determines the determinant for a 2×2 matrix containing said syndromes;

a fifth portion which, if said determinant of said 2×2 matrix is not equal to 0, returns a value of 2 for said number of errors in the codeword;

a sixth portion which, if said determinant of said 2×2 matrix is not equal to 0, determines the determinant for a 1×1 matrix containing said syndromes;

a seventh portion which, if said determinant of said 1×1 matrix is not equal to 0, returns a value of 1 for said number of errors in the codeword; and an eighth portion, which if said determinant of said 1×1 matrix is equal 0, returns a condition that errors were detected in the codeword, but those errors are unsolvable;

an error locator polynomial determiner which finds the error locator polynomial of the codeword;

an error location finder which determines the locations of the errors by finding the inverses of the roots of said error locator polynomial; and an error value finder which determines the value of the errors by using the locations of the errors and the syndromes.

4. An apparatus for decoding an RS codeword in a communications system comprising:

a receiver which receives and stores the codeword in memory;

a syndrome finder which determines the syndromes of the codeword;

an error quantity determiner which determines the number of errors in the codeword using said syndromes, wherein said error quantity determiner comprises:

a first portion which returns a value of 0 for said number of errors in the codeword and ends the decoding process if all the said syndromes are equal to 0;

a second portion which determines the determinant for a 3×3 matrix containing said syndromes;

a third portion which, if said determinant of said 3×3 matrix is not equal to 0, returns a value of 3 for said number of errors in the codeword;

a fourth portion which, if said determinant of said 3×3 matrix is not equal to 0, determines the determinant for a 2×2 matrix containing said syndromes;

a fifth portion which, if said determinant of said 2×2 matrix is not equal to 0, returns a value of 2 for said number of errors in the codeword;

a sixth portion which, if said determinant of said 2×2 matrix is not equal to 0, determines the determinant for a 1×1 matrix containing said syndromes;

a seventh portion which, if said determinant of said 1×1 matrix is not equal to 0, returns a value of 1 for said number of errors in the codeword; and an eighth portion, which if said determinant of said 1×1 matrix is equal 0, returns a condition that errors were detected in the codeword, but those errors are unsolvable;

an error locator polynomial determiner which finds the error locator polynomial of the codeword;

an error location finder which determines the locations of the errors by finding the inverses of the roots of said error locator polynomial; and an error value finder which determines the value of the errors by using the locations of the errors and the syndromes;

a corrector which corrects the codeword in memory using said error locations and said error values; and a decoder which decodes the modified codeword.

* * * * *